(12) United States Patent
Bortolini et al.

(10) Patent No.: US 6,175,501 B1
(45) Date of Patent: Jan. 16, 2001

(54) METHOD AND ARRANGEMENT FOR COOLING AN ELECTRONIC ASSEMBLY

(75) Inventors: James R. Bortolini, Broomfield; Scott E. Farleigh, Denver, both of CO (US); Gary J. Grimes, Birmingham, AL (US); Charles J. Sherman, Westminster; Jean S. Nyquist, Denver, both of CO (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/224,602

(22) Filed: Dec. 31, 1998

(51) Int. Cl.[7] ....................................................... H05K 7/20
(52) U.S. Cl. ........................ 361/720; 361/690; 361/717; 174/16.3; 174/252; 257/717
(58) Field of Search ................................... 361/687, 689, 361/695–690, 704–710, 717–721, 752, 754, 784–785, 816, 818; 257/706–727; 174/16.3, 52.1, 252, 35 R; 165/80.2, 80.4, 122, 137, 104.33, 104.34; 62/259.2; 29/827, 840, 842

(56) References Cited

U.S. PATENT DOCUMENTS

| | | |
|---|---|---|
| 4,493,010 | 1/1985 | Morrison et al. . |
| 4,805,420 | * 2/1989 | Porter et al. ........................ 62/514 R |
| 6,052,284 | 4/2000 | Suga et al. . |

OTHER PUBLICATIONS

Liquid–Cooled Electronic Components for Low–End Machines, IBM Technical Disclosure Bulletin, vol. 17, No. 3, Aug. 1974.

\* cited by examiner

Primary Examiner—Leo P. Picard
Assistant Examiner—Michael Datskovsky
(74) Attorney, Agent, or Firm—Maginot, Addison & Moore

(57) ABSTRACT

An arrangement for cooling an electronic assembly includes a circuit board having a primary circuit board portion and a secondary circuit board portion integrally secured to the primary circuit board portion. The arrangement also includes an enclosure member secured to the circuit board so as to create a fluid tight barrier of a compartment defined at least in part by the enclosure member. The arrangement further includes a first electronic component secured to the primary circuit board portion such that the first electronic component is located within the compartment. The arrangement also includes a second electronic component secured to the secondary circuit board portion such that the second electronic component is located outside of the compartment. The arrangement also includes a liquid disposed within the compartment such that the liquid is in a heat exchange relationship with the first electronic component. The arrangement also includes a gas in contact with the second electronic component such that the gas is in a heat exchange relationship with the second electronic component.

21 Claims, 5 Drawing Sheets

METHOD AND ARRANGEMENT FOR COOLING AN ELECTRONIC ASSEMBLY

FIELD OF THE INVENTION

The present invention relates generally to electronic assemblies, and in particular, to a method and arrangement for cooling an electronic assembly.

BACKGROUND OF THE INVENTION

Electronic assemblies which include a circuit board having a plurality of electronic components attached thereto are widely used in the communications industry to manage the flow of data on a telecommunications network. These electronic assemblies must be able to manage a high data rate over significant periods of time (e.g., months) without any maintenance. One problem encountered with these electronic assemblies, as well as other types of electronic assemblies, is that the above described data management activity causes the electronic components to generate a significant amount of heat which can be detrimental to the electronic assembly and thus cause maintenance problems. As a result, these electronic assemblies must be cooled constantly in order to maintain acceptable operating temperatures to avoid maintenance problems.

Several different approaches have been utilized in an attempt to address the aforementioned cooling requirement. For example, one approach employs assisted cooling techniques to maintain the electronic assembly within acceptable temperature limits. These assisted cooling techniques typically involve externally-powered cooling devices, such as fans. In a telecommunication central office switch, large fans are employed to provide the necessary cooling to the electronic assemblies. However, the use of assisted cooling techniques are discouraged by the communications industry because assisted cooling techniques can introduce a hazard to technicians working in the area. For example, the use of large fans can undesirably create a hazardous noise level. In addition, the types of fans used in assisted cooling tend to break down and thus increase the maintenance problems associated with servicing the telecommunications network.

Another approach utilizes a liquid to cool the electronic components attached to the circuit board. However, several different kinds of electronic components are used on the circuit boards, and many of the electronic components can not be cooled by a liquid. For example, many optoelectronic devices, such as laser transmitters, are not amenable to liquid cooling. Accordingly, if liquid cooling is desirable in a circuit having components that are not amenable to liquid cooling, the air cooled components must be segregated from the liquid cooled environment. Such situations typically require separate air cooled and liquid cooled circuit boards.

In one such design, one or more circuit boards having electronic components thereon which can be cooled in a liquid environment are completely housed in a box filled with a cooling liquid. Such a design electrically interconnects the gas cooled or air cooled electronic components to the liquid cooled electronic components utilizing special insulated feedthroughs which must extend through a wall of the box so as to interface with the liquid cooled electronic components. These feedthroughs often introduce signal reflections and impedance discontinuities in the signal path, thereby limiting the bandwidth which can effectively be transmitted. In addition, these designs often suffer from the problem of leaks at the point where the feedthrough penetrates the box wall.

There is an additional need, therefore, for a method and arrangement for cooling an electronic assembly which overcomes one or more of the above discussed problems.

SUMMARY OF THE INVENTION

The present invention fulfills the above need, as well as others, by providing an arrangement for cooling an electronic assembly that has a liquid cooled portion and an air cooled portion disposed on the same circuit board. Because the liquid cooled portion and the air cooled portion are disposed on the same circuit board, signals may be communicated through the board itself, thereby eliminating the need for the insulated feedthroughs of the prior art that are prone to leakage and signal reflection.

In one embodiment, the present invention provides an arrangement for cooling an electronic assembly. The arrangement includes a circuit board having a primary circuit board portion and a secondary circuit board portion integrally secured to the primary circuit board potion. The arrangement also includes an enclosure member secured to the circuit board so as to create a fluid tight barrier of a compartment defined at least in part by the enclosure member. The secondary circuit board portion is disposed outside of the compartment. The arrangement further includes a first electronic component secured to the primary circuit board portion such that the first electronic component is located within the compartment. The arrangement also includes a second electronic component secured to the secondary circuit board portion such that the second electronic component is located outside of the compartment. The arrangement also includes a liquid disposed within the compartment such that the liquid is in a heat exchange relationship with the first electronic component. The arrangement also includes a gas in contact with the second electronic component such that the gas is in a heat exchange relationship with the second electronic component.

In another embodiment, the present invention provides a method for cooling an electronic assembly which includes a circuit board having (i) a primary circuit board portion with a first electrical component attached thereto and (ii) a secondary circuit board portion with a second electrical component attached thereto, the secondary circuit board portion being integral to the primary circuit board portion. The method includes the steps of (i) securing an enclosure member to the primary circuit board portion so as to create a fluid tight barrier of a compartment defined at least in part by the primary circuit board portion and the enclosure member, (ii) disposing a liquid in the compartment such that the liquid and the first electronic component are in a heat exchange relationship, (iii) preventing the liquid from contacting the second electronic component with the fluid tight barrier, and (iv) contacting the second electronic component with a gas such that the gas and the second electronic component are in a heat exchange relationship.

The above described embodiments provide further benefits of locating both liquid cooled and air cooled components on a single circuit board, which may help reduce the overall size of a circuit that includes both liquid and air cooled components.

The above features and advantages, as well as others, will become more readily apparent to those of ordinary skill in the art by reference to the following detailed description and accompanying drawings.

DETAILED DESCRIPTION

Figure 1:
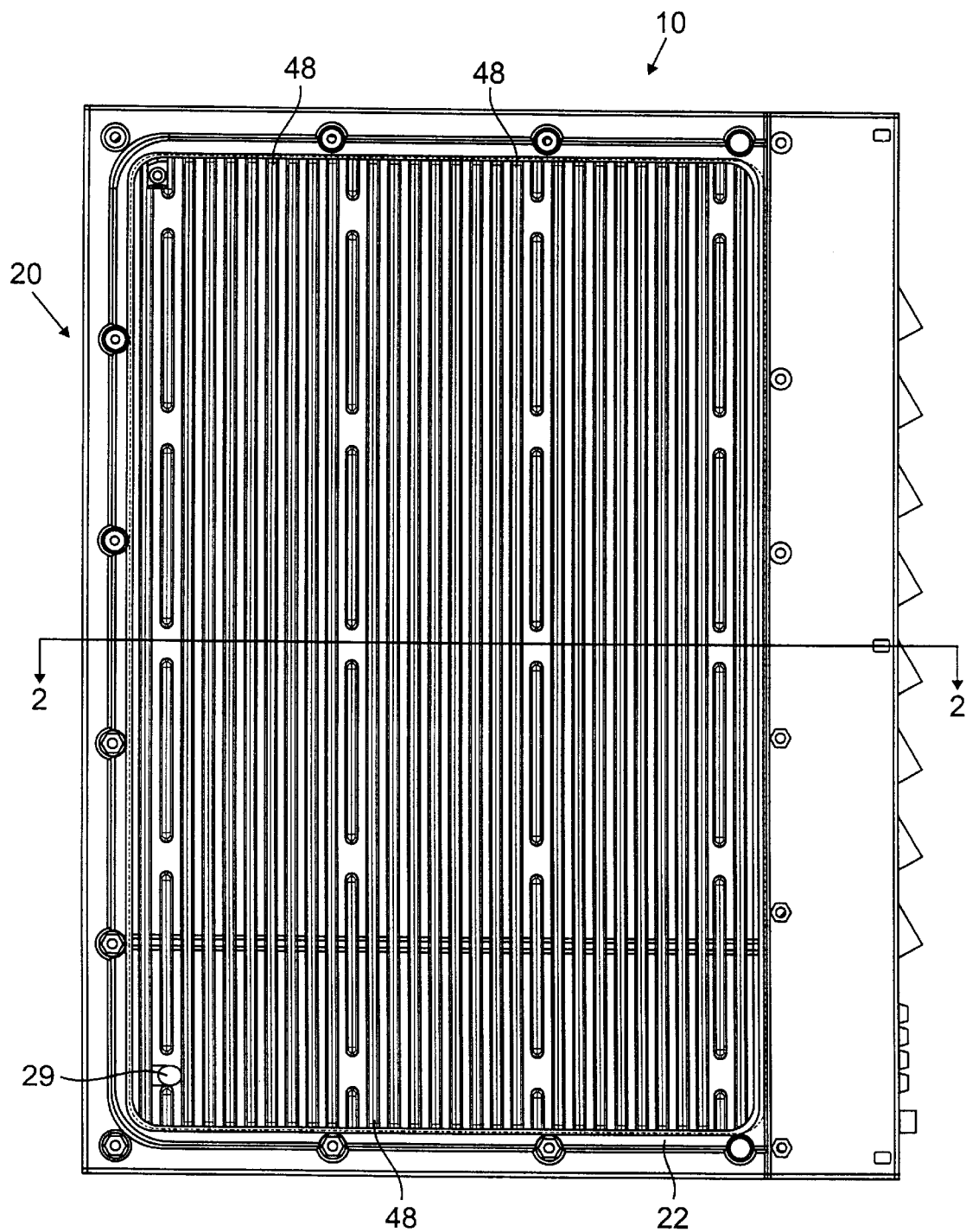
FIG. 1 shows a side elevational view of an arrangement for cooling an electronic assembly which incorporates the features of the present invention therein.

Referring to FIGS. 1, 2, 3, and 4, there is shown an arrangement 10 for cooling an electronic assembly 12 which incorporates the features of the present invention therein. The arrangement 10 includes an enclosure member 20 and a circuit board 14. The arrangement 10 also includes a plurality of electronic components attached to circuit board 14. This plurality of electronic components includes switching devices, power management devices, filter devices, memory devices, and processor devices. However, hereinafter, only a first electronic component 30 and a second electronic component 34 will be discussed in detail for clarity of description. The arrangement 10 further includes a fluid 32, a gas 36, a first sealing member 38, a second sealing member 40, a first wall segment 42, a second wall segment 44, and a plurality of fins 48.

The enclosure member 20 includes a first plate member 22, a second plate member 24, a plurality of fins 48, first and second wall segments 42 and 44, and at least one sealing member channel 68. The plurality of fins 40 extend perpendicularly from each of the first and second plate members 22 and 24. The first wall segment 42 extends from one edge of the plate member 22 and the second wall segment 44 extends from the second plate member 24. The sealing member channel 68 is disposed at the periphery of the first plate member 22, and is in part disposed between the first plate member 22 and the first wall segment 42. In a substantially identical manner, a sealing member channel (not shown) is also disposed at the periphery of the second plate member 24.

The circuit board 14 includes a primary circuit board portion 16 and a secondary circuit board portion 18 integrally secured to the primary circuit board portion 16. The circuit board 14 also has a first surface 58 and a second surface 60 defined thereon. The primary circuit board portion 16 includes at its periphery a sealing member location 64 defined on first surface 58. The primary circuit board portion 16 also has a sealing member location (not shown) defined on the second surface 60 which is substantially identical to the sealing member location 64. As shown more clearly in FIG. 4, a segment 66 of the sealing member location 64 is interposed between the primary circuit board portion 16 and the secondary circuit board portion 18. In a similar manner, a segment (not shown) of the sealing member location (not shown) defined on the second surface 60 is interposed between the primary circuit board portion 16 and the secondary circuit board portion 18.

The first electronic component 30 is an electronic device that generates heat during operation and may be liquid cooled. The second electronic component 34 is a device that is not amenable to liquid cooling, such as, for example, an optical transmitter. The first electronic component 30 is secured to the primary circuit board portion 16 such that the first electronic component 30 is located on the first surface 58 of the circuit board 14. For reasons that will be discussed in further detail below, it is preferable to place all of the circuit components in the primary circuit board portion 16 on one side of the circuit board 14, or in other words on the first surface 58. In any event, the second electronic component 34 is similarly secured to the secondary circuit board portion 18 such that the second electronic component 34 is also located on the first surface 58 of the circuit board 14.

Figure 2:
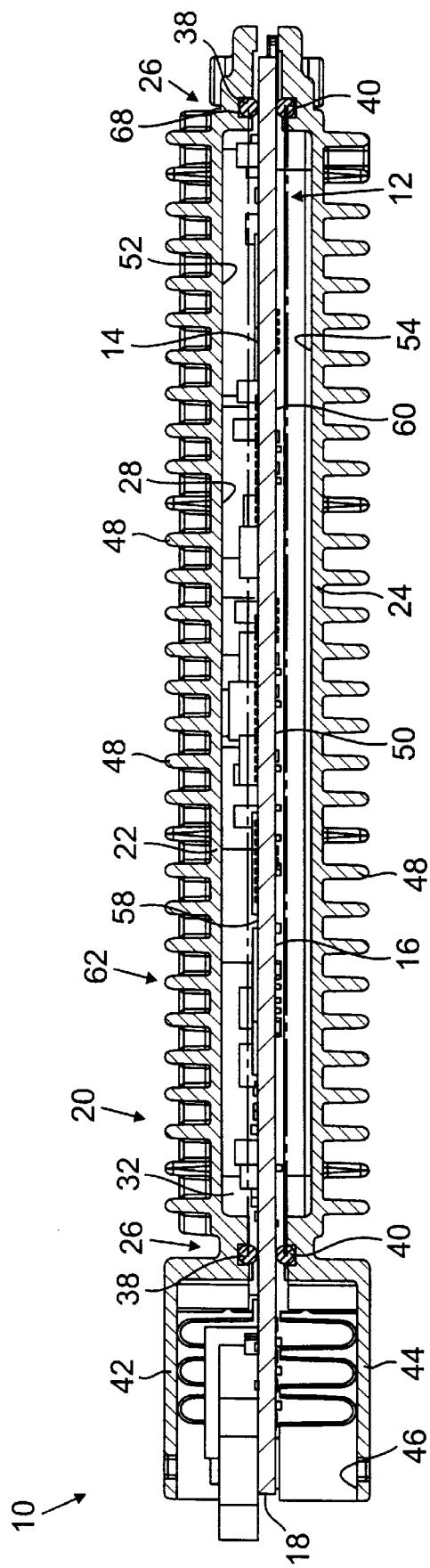
FIG. 2 is a cross sectional view of the arrangement of FIG. 1 taken along the line 2—2 as viewed in the direction of the arrows.
Figure 4:
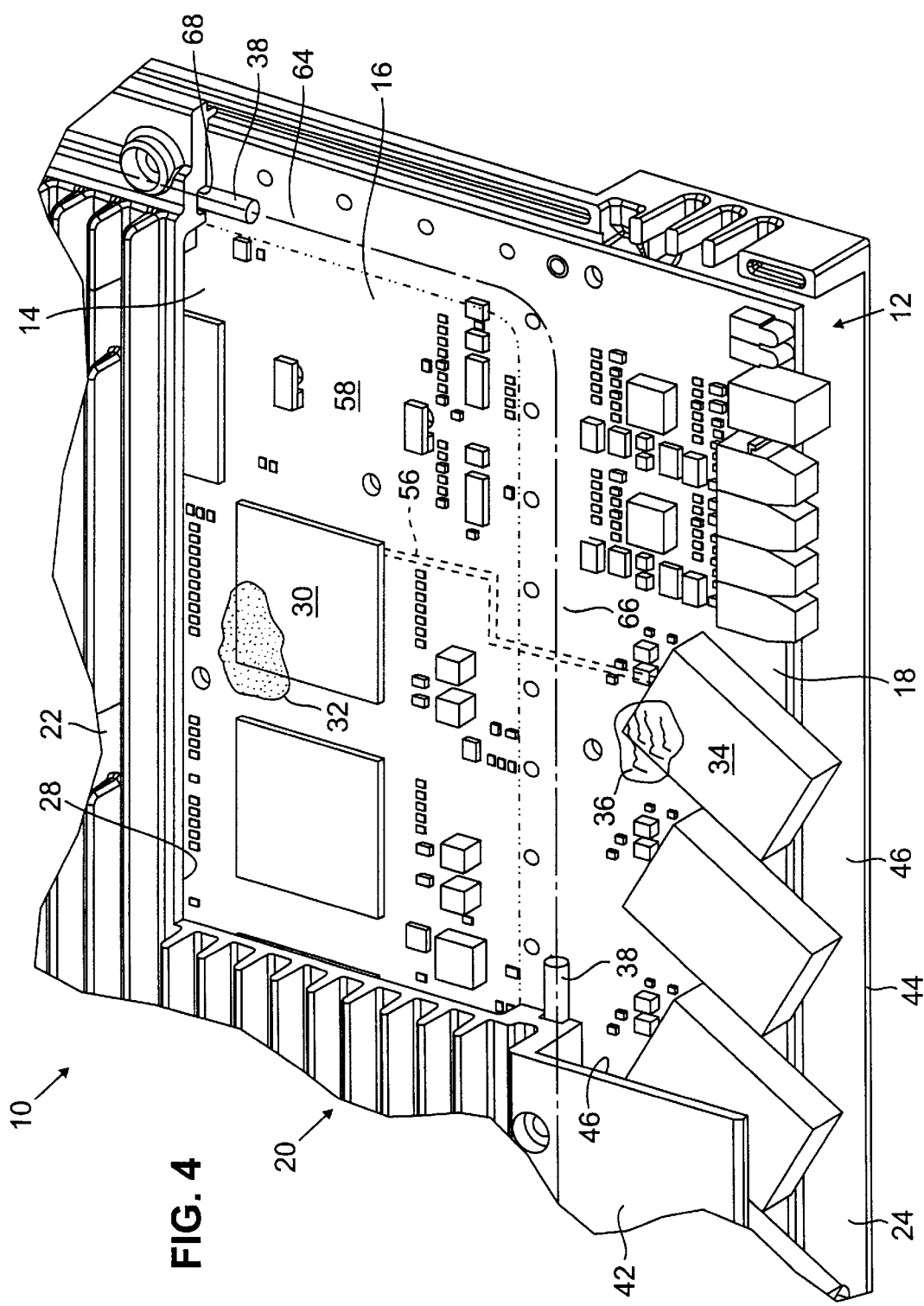
FIG. 4 is an enlarged view of a portion of FIG. 3.

As shown more clearly in FIGS. 2 and 4, the first sealing member 38 is positioned on the sealing member location 64 of the primary circuit board portion 16. The first plate member 22 is then positioned relative to the circuit board 14 such that the first sealing member 38 is (i) positioned within the sealing member channel 68 and (ii) interposed between the primary circuit board portion 16 and the first plate member 22. The first sealing member 38 may suitably be a rubber gasket having, for example, a circular cross section when uncompressed. The first sealing member 38 should be chemically resistant to the liquid coolant that is employed within the arrangement 10 as discussed further below.

The second sealing member 40 is substantially identical to the first sealing member 38. The second sealing member 40 is positioned on the sealing member location (not shown) defined on the second surface 60 in a similar manner as that described above for the first sealing member 38. The second plate member 24 is then positioned relative to the circuit board 14 such that the second sealing member 40 is (i) positioned within the sealing member channel defined in the second plate member 24 and (ii) interposed between the primary circuit board portion 16 and the second plate member 24.

Once the first plate member 22, the first sealing member 38, the circuit board 14, the second sealing member 40, and the second plate member 24 are positioned in the above described manner, the first plate member 22 and the second plate member 24 are secured together and to the circuit board 14 via a number of fasteners (e.g., screws) inserted through holes defined in the first plate member 22, the second plate member 24, and the circuit board 14.

It should be understood that positioning and securing the first plate member 22, the first sealing member 38, the circuit board 14, the second sealing member 40, and the second plate member 24 in the above described manner results in the enclosure member 20 and the primary circuit board portion 16 cooperating so as to create a fluid tight barrier 26 of a compartment 28. In particular, the first plate member 22, the first sealing member 38, the primary circuit board portion 16, the second sealing member 40, and the second plate member 24 cooperate so as to create the fluid tight barrier 26 of the compartment 28.

Figure 5:
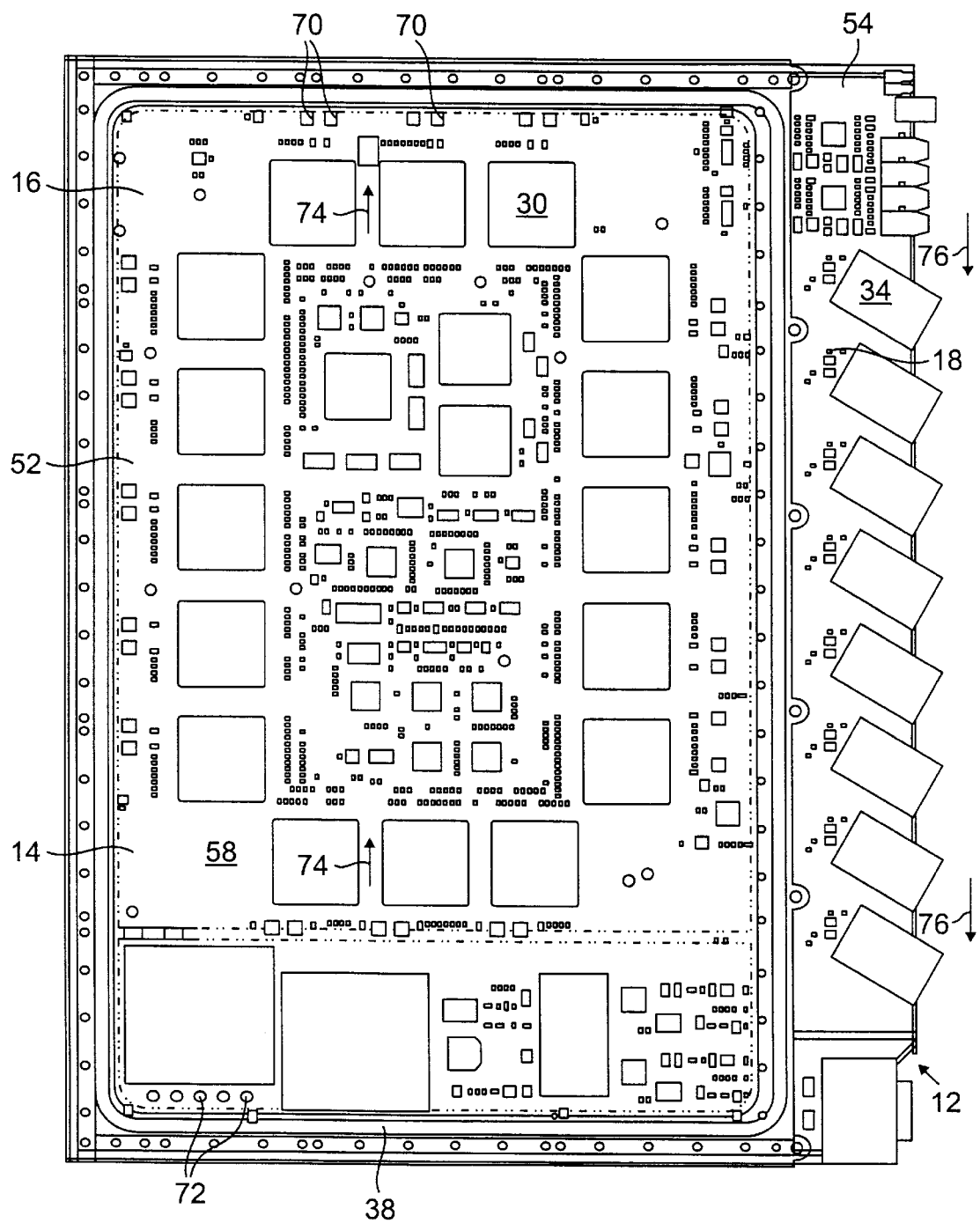
FIG. 5 is a view similar to the one shown in FIG. 1, but showing the first plate member removed for clarity of description.

It should be appreciated that the above described arrangement of the aforementioned components locates the primary circuit board portion 16 within the compartment 28 such that the primary circuit board portion 16 defines a partition 50 which divides compartment 28 into a first subcompartment 52 and a second subcompartment 54 as shown in FIG. 2. Moreover, as shown in FIG. 5, the primary circuit board portion 16 has a number of upper apertures 70 defined therein and a number of lower apertures 72 defined therein. The upper apertures 70 and the lower apertures 72 allow fluid communication between the first subcompartment 52 and the second subcompartment 54 of the compartment 28.

It should also be appreciated that, since the first electronic component 30 is secured to the primary circuit board portion, the first electronic component 30 is also located within the compartment 28. In particular, the first electronic component 30 is located within the first subcompartment 52 of the compartment 28. It should further be appreciated that the above described arrangement locates the secondary circuit board portion 18 outside of the compartment 28. Furthermore, since the second electronic component 34 is secured to the secondary circuit board portion 18, the second electronic component 34 is located outside of the compartment 28.

However, it should be understood that, as shown in FIG. 4, the first electronic component 30 is electrically coupled to the second electronic component 34 via at least one conductive trace 56. A segment of the trace 56 is interposed between the first surface 58 and the second surface 60 of the circuit board 14 while each end of trace 56 extends through first surface 58 so as to be electrically interfaced either directly or indirectly with the first electronic component 30 and the second electronic component 34. It should be appreciated that, while only first electronic component 30 and second electronic component 34 are shown electrically coupled via a trace interposed between the first surface 58 and the second surface 60 of the circuit board 14, several of the electronic components located within the compartment 28 may be electrically coupled to electronic components located outside of the compartment 28 (i.e. on secondary circuit board portion 18) utilizing similar traces interposed between the first surface 58 and the second surface 60 of the circuit board 14.

Figure 3:
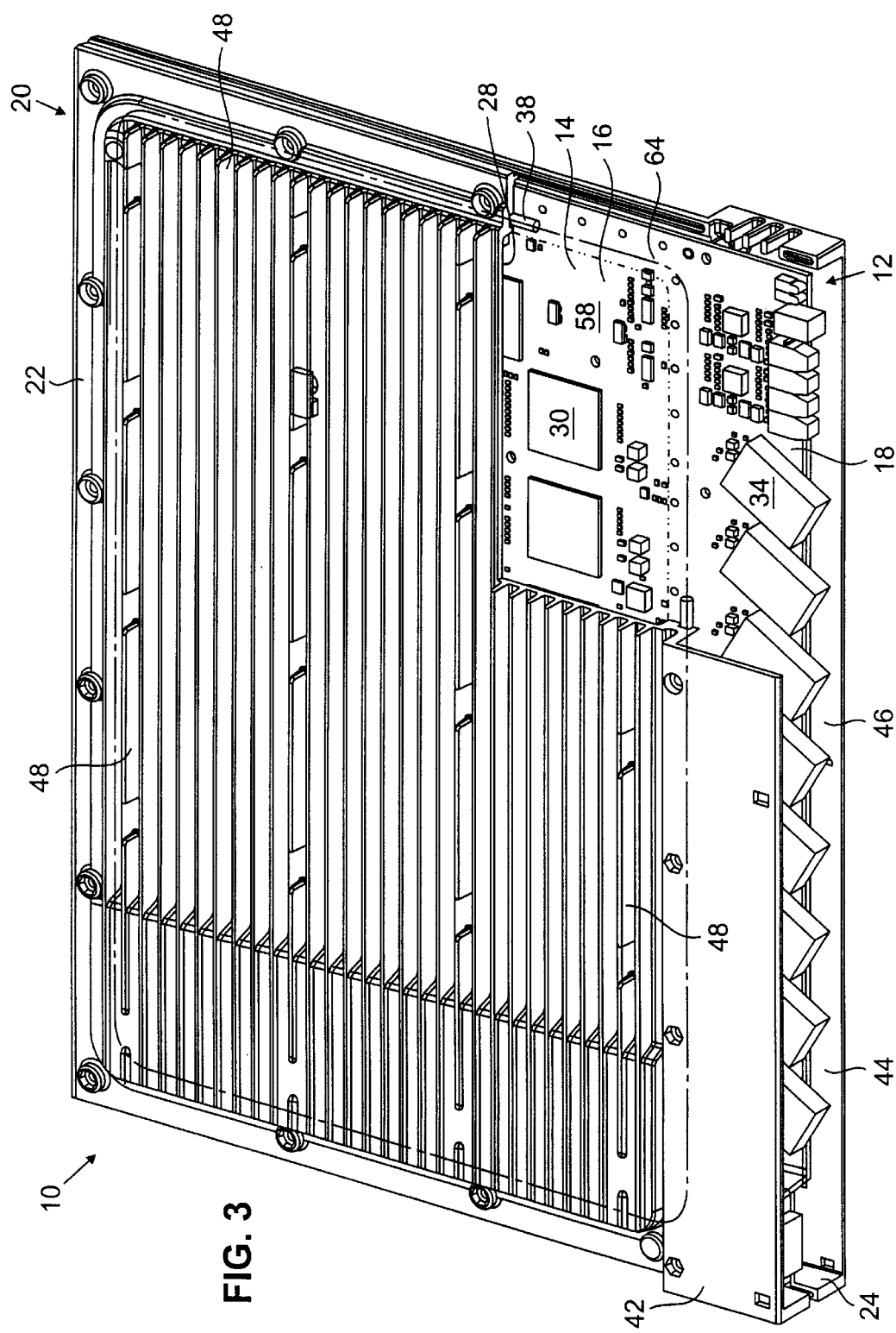
FIG. 3 is a perspective fragmentary view of the arrangement of FIG. 1.

Attaching the first plate member 22 and the second plate member 24 to each other as previously described results in the first wall segment 42 and the second wall segment 44 cooperating so as to define a cavity 46 as clearly shown in FIGS. 2, 3, and 4. The secondary circuit board portion 18 is positioned within cavity 46. Moreover, since the second electronic component 34 is attached to the secondary circuit board portion 18, the second electronic component 34 is also positioned within the cavity 46.

As shown in FIGS. 2 and 4, a liquid 32 is disposed within the compartment 28 via a port (not shown) defined in the first plate member 22. Preferably, the liquid 32 is disposed within the compartment 28 such that the liquid 32 is in direct contact with all of the electronic components secured to the primary circuit board portion 16. To this end, the enclosure member 20 includes a rotatably insertable fluid stop 29 that fits into an aperture in the first plate member 22. After the first plate member 22 and the second plate member 24 are secured to each other as described above, the liquid 32 is disposed into the compartment 28 through the aperture. The fluid stop 29 is then secured into the aperture to enclose the liquid 32 in the compartment 28.

As shown in FIG. 4, the liquid 32 is in direct contact with the first electronic component 30. It should be understood that the liquid 32 can pass through upper apertures 70 and lower apertures 72 such that both the first subcompartment 52 and a second subcompartment 54 of the compartment 28 are nearly full of liquid 32. Preferably, the liquid 32 is a cooling fluorocarbon liquid, such as the commercially available product Fluorinert FC-77, which is available from Minnesota Mining & Manufacturing, Inc.

As depicted in FIG. 4, the cavity 46 allows a gas 36, such as air, to come into direct contact with the electronic components (e.g. second electronic component 34) attached to the secondary circuit board portion 18.

It should be understood that the compartment 28 is fluid tight. Therefore, the compartment 28 prevents the liquid 32 from entering the cavity 46 and coming into contact with any of the electronic components attached to the secondary circuit board portion 18 (e.g. the second electronic component 34). In particular, the fluid tight barrier 26 prevents the liquid 32 from contacting any of the electronic components attached to the secondary circuit board portion 18. Therefore, it should be appreciated that the electronic components attached to the circuit board 14 are segregated into two separate environments. Specifically, the electronic components secured to the primary circuit board portion 16 (e.g. first electronic component 30) of the circuit board 14 are bathed in a liquid environment provided by the liquid 32. On the other hand, the electronic components secured to the secondary circuit board portion 18 (e.g. second electronic component 34) are located in a gaseous environment, i.e., the air.

During use of the arrangement 10, the electronic components attached to the circuit board 14 generate a significant amount of heat. However, this heat is effectively managed by the advantageous design features of the present invention. In general, the liquid 32 transfers heat from the electronic components towards the enclosure member 20. The enclosure member 20, which is preferably constructed of a heat conducting material such as aluminum, conducts heat to the fins 46 thereon. The fins 46 provide a substantial amount of surface area for the heat to dissipate.

In addition, the design features of the present invention results in the liquid 32 (see FIG. 4) circulating through the compartment 28 so as to enhance the heat exchange between the electronic components attached to primary circuit board portion 16 and the enclosure member 20. In particular, having all of the electronic components attached to the primary circuit board portion 16 positioned on the first surface 58 of the circuit board 14 causes the temperature of the liquid 32 located in the first subcompartment 52 to rise relative to the liquid 32 located in the second subcompartment 54 since all of the heat generating electronic components are located within the first subcompartment 52. Therefore, a temperature gradient is established between the liquid 32 located in the first subcompartment 52 and the liquid 32 located in the second subcompartment 54. In particular, the temperature gradient is such that the liquid 32 located in the first subcompartment 52 is warmer than the liquid 32 located in the second subcompartment 54.

During use, the electronic assembly 12 is vertically oriented as shown in FIG. 5. Therefore, since relatively warm liquid tends to rise while relatively cool liquid tends to sink, the relatively warm liquid 32 located in the first subcompartment 52 will rise in the direction indicated by arrows 74 (see FIG. 5), while the relatively cool liquid 32 located in the second subcompartment 54 will sink in the direction indicated by arrows 76 (see FIG. 5). (Note that although the second subcompartment 54 is not shown in FIG. 5, the arrows 76 illustrate direction of flow of the relatively cool liquid 32 within the second subcompartment 54). As the relatively warm liquid 32 located in the first subcompartment 52 rises in the above described manner, the liquid 32 is advanced through the upper apertures 70 and thus enters the second subcompartment 54. On the other hand, as the relatively cool liquid 32 located in the second subcompartment 54 sinks in the above described manner, the liquid 32 is advanced through the lower apertures 72 and thus enters the first subcompartment 52. Once located in the second subcompartment 54, the relatively warm liquid 32 begins to cool and thus sink since no heat generating electronic components are located within second subcompartment 54. Once located in first subcompartment 52, the relatively cool liquid 32 begins to warm and thus rise as it comes into contact with the heat generating electronic components located within the first subcompartment 52.

The above described convection causes continuous circulation of the liquid 32 between the first subcompartment 52 and the second subcompartment 54. This continuous circulation of the liquid 32 significantly enhances the heat exchange relationship between the electronic components located within the compartment 28 and the liquid 32. In particular, the circulation of the liquid increases the rate of heat transfer to more surface areas of the enclosure member 20.

The electronic components located in a gaseous environment, i.e. those electronic components attached to secondary circuit board portion 18, are in a heat exchange relationship with gas 36, e.g. air. These components are effectively cooled by air convection cooling.

The above described combination of cooling some of the electronic components attached to the circuit board 14 with liquid 32 (e.g., the first electronic component 30) while cooling other electronic components attached to the circuit board 14 with gas 36 (e.g., the second electronic component 34) effectively maintains the temperature of the electronic assembly 12 within acceptable limits without any assisted cooling. For example, the arrangement 10 of the present invention can effectively cool a 100 watt circuit board without the use of assisted cooling (i.e., without the use of fans). The present invention achieves such heat dissipation through the use of liquid cooling, further enhanced by the continuous circulation of the liquid within the compartment 28.

The arrangement 10 of the present invention also allows electronic components which have different abilities to tolerate heat to be attached to the same circuit board. Consider a situation in which the first electronic component 30 is an integrated circuit and the second electronic component 34 is an optoelectronic device. The integrated circuit device is typically capable of tolerating a greater amount of heat than the optoelectronic device. The arrangement 10 of the present invention allows both of these electronic components to be secured to a single circuit board, i.e. circuit board 14, while substantially isolating the optoelectronic device from the relatively hot environment in which the integrated circuit devices operate. This isolation is achieved by locating heat tolerant electronic components (e.g., the first electronic component 30) within the compartment 28, while locating electronic components which are relatively heat sensitive (e.g., the second electronic component 34) outside of the compartment 28, away from the heat tolerant electronic components. The ability to locate both heat tolerant and heat sensitive electronic components on a single circuit board is advantageous because the resulting circuit benefits from better electrical connections inherent in single board construction.

The present invention thus provides significant advantages over designs that do not allow gas cooled and liquid cooled electronic components on the same circuit board. These types of designs typically include at least one or more circuit boards having electronic components thereon being cooled in a gaseous environment, and other circuit boards having electronic components thereon being cooled in a liquid environment. Specifically, the circuit boards cooled in a liquid environment are typically completely housed in a box filled with a cooling liquid. These designs electrically interconnect the gas cooled electronic components to the liquid cooled electronic components utilizing special insulated feedthroughs which must extend through a wall of the box so as to interface with the liquid cooled electronic components contained therein. These feedthroughs always introduce a large impedance discontinuity in the signal path, thereby limiting the bandwidth which can be transmitted. In addition, these designs suffer from the problem of leakage of the cooling liquid at the point where the feedthrough penetrates the box wall. The present invention avoids the aforementioned problems by having the liquid cooled electronic components and the gas cooled electronic components on a single circuit board (i.e., circuit board 14) and having the liquid and gas cooled electronic components coupled via traces interposed between first surface 58 and second surface 60 of circuit board 14.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected. For example, the enclosure member 20 of the present invention need not comprise two opposing plate members as described above, but instead may be a single piece enclosure that cooperates with the circuit board 14 to form a fluid tight container.

We claim:

1. An arrangement for cooling an electronic assembly, the arrangement comprising:
   a rigid circuit board having a primary circuit board portion and a secondary circuit board portion integrally secured to said primary circuit board portion;
   an enclosure member secured to said circuit board so as to form a fluid tight barrier of a compartment defined at least in part by said enclosure member, said secondary circuit board portion being disposed outside of said compartment;
   a first electronic component secured to said primary circuit board portion such that said first electronic component is located within said compartment;
   a second electronic component secured to said secondary circuit board portion such that said second electronic component is located outside of said compartment;
   a liquid disposed within said compartment such that said liquid is in a heat exchange relationship with said first electronic component; and
   a gas in contact with said second electronic component such that said gas is in a heat exchange relationship with said second electronic component.

2. The arrangement of claim 1, wherein:
   said enclosure member and said primary circuit board portion cooperate so as to create said fluid tight barrier of said compartment.

3. The arrangement of claim 1, wherein:
   said enclosure member includes a first plate member and a second plate member, and
   said first plate member, said second plate member, and said primary circuit board portion cooperate so as to create said fluid tight barrier of said compartment.

4. The arrangement of claim 3, further comprising:
   a first sealing member interposed between said first plate member and said primary circuit board portion; and
   a second sealing member interposed between said second plate member and said primary circuit board portion,
   wherein said first plate member, said first sealing member, said primary circuit board portion, said second sealing member, and said second plate member cooperate so as to so as to create said fluid tight barrier of said compartment.

5. The arrangement of claim 3, further comprising:
   a first wall segment extending from said first plate member;
   a second wall segment extending from said second plate member,
   wherein (i) said first wall segment and said second wall segment define a cavity and (ii) said secondary circuit board portion is positioned within said cavity.

6. The arrangement of claim 1, wherein:
   said first electronic component includes an integrated circuit device, and
   said second electronic includes an optoelectronic device.

7. The arrangement of claim 1, further comprising:
   a plurality of fins extending from said enclosure member so as to enhance cooling of said first electronic component.

8. The arrangement of claim 1, wherein:

said liquid includes a fluorocarbon.

9. A method for cooling an electronic assembly which includes a rigid circuit board having (i) a primary circuit board portion with a first electrical component attached thereto and (ii) a secondary circuit board portion with a second electrical component attached thereto, said secondary circuit board portion being integral to said primary circuit board portion, comprising the steps of:

securing an enclosure member to said primary circuit board portion so as to create a fluid tight barrier of a compartment defined at least in part by said enclosure member;

disposing a liquid in said compartment such that said liquid and said first electronic component are in a heat exchange relationship;

preventing said liquid from contacting said second electronic component with said fluid tight barrier; and contacting said second electronic component with a gas such that said gas and said second electronic component are in a heat exchange relationship.

10. The method of claim 9, wherein:

said disposing step includes the step of directly contacting said liquid with said first electronic component.

11. The method of claim 9, wherein:

said securing step includes the step of securing said enclosure member to said primary circuit board portion such that said enclosure member and said primary circuit board portion cooperate so as to create said fluid tight barrier of said compartment.

12. The method of claim 9, wherein:

said enclosure member includes a first plate member and a second plate member, and said securing step includes the step of securing said first plate member and said second plate member to said primary circuit board portion such that said first plate member, said second plate member, and said primary circuit board portion cooperate so as to create said fluid tight barrier of said compartment.

13. The method of claim 12, wherein said step of securing said first plate member and said second plate member to said primary circuit board portion includes the steps of:

interposing a first sealing member between said first plate member and said primary circuit board portion; and interposing a second sealing member between said second plate member and said primary circuit board portion, so that said first plate member, said first sealing member, said primary circuit board portion, said second sealing member, and said second plate member cooperate so as to so as to create said fluid tight barrier of said compartment.

14. The method of claim 12, wherein:

said first plate member includes a first wall segment which extends from said first plate member, said second plate member includes a second wall segment which extends from said second plate member, said first wall segment and said second wall segment cooperate to define a cavity, and said step of securing said first plate member and said second plate member to said primary circuit board portion includes the step of positioning said secondary circuit board portion within said cavity.

15. The method of claim 9, wherein:

said first electronic component includes an integrated circuit device, and said second electronic includes an optoelectronic device.

16. The method of claim 9, wherein:

said enclosure member includes a plurality of fins extending therefrom so as to enhance cooling of said first electronic component.

17. The method of claim 9, wherein:

said fluid includes a flurocarbon.

18. An arrangement for cooling an electronic assembly, the arrangement comprising:

a rigid circuit board having a primary circuit board portion and a secondary circuit board portion integrally secured to said primary circuit board potion;

an enclosure member having a first plate member and a second plate member, said first plate member and said second plate member being secured to said circuit board such that said first plate member, said second plate member, and said primary circuit board portion cooperate so as to create a fluid tight barrier of a compartment defined by said primary circuit board portion, said first plate member, and said second plate member, said secondary circuit board portion being disposed outside of said compartment;

a first electronic component secured to said primary circuit board portion such that said first electronic component is located within said compartment; and a second electronic component secured to said secondary circuit board portion such that said second electronic component is located outside of said compartment.

19. The arrangement of claim 18, further comprising:

a liquid disposed within said compartment such that (i) said liquid is in a heat exchange relationship with said first electronic component and (ii) said liquid is prevented from contacting said second electronic component by said fluid tight barrier.

20. The arrangement of claim 18, wherein:

said first electronic component includes an integrated circuit device, and said second electronic includes an optoelectronic device.

21. An arrangement for cooling an electronic assembly, the arrangement comprising:

a circuit carrying rigid substrate having a primary portion and a secondary portion integrally secured to said primary portion;

an enclosure member secured to said substrate so as to form a fluid tight barrier of a compartment defined at least in part by said enclosure member, said secondary portion being disposed outside of said compartment, said enclosure member including a plurality of fins extending therefrom so as to enhance cooling of said first electronic component;

a first electronic component secured to said primary portion such that said first electronic component is located within said compartment;

a second electronic component secured to said secondary portion such that said second electronic component is located outside of said compartment;

a liquid disposed within said compartment such that said liquid is in a heat exchange relationship with said first electronic component; and a gas in contact with said second electronic component such that said gas is in a heat exchange relationship with said second electronic component.

* * * * *